United States Patent
Hong

(10) Patent No.: US 9,437,500 B1
(45) Date of Patent: Sep. 6, 2016

(54) METHOD OF FORMING SUPRA LOW THRESHOLD DEVICES

(71) Applicant: FREESCALE SEMICONDUCTOR, INC., Austin, TX (US)

(72) Inventor: Cheong Min Hong, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/656,844

(22) Filed: Mar. 13, 2015

(51) Int. Cl.
| | |
|---|---|
| *H01L 29/788* | (2006.01) |
| *H01L 21/8234* | (2006.01) |
| *H01L 21/311* | (2006.01) |
| *H01L 27/115* | (2006.01) |

(52) U.S. Cl.
CPC .. *H01L 21/823462* (2013.01); *H01L 21/31111* (2013.01); *H01L 21/823418* (2013.01); *H01L 27/115* (2013.01)

(58) Field of Classification Search
CPC .............. H01L 21/823462; H01L 21/31111; H01L 21/823418; H01L 27/115
See application file for complete search history.

(56) References Cited

U.S. PATENT DOCUMENTS

| | | | | |
|---|---|---|---|---|
| 5,917,218 | A * | 6/1999 | Choi | H01L 27/11546 257/345 |
| 7,042,051 | B2 * | 5/2006 | Ootsuka | H01L 21/823807 257/344 |
| 7,821,055 | B2 | 10/2010 | Loiko et al. | |
| 8,372,699 | B2 | 2/2013 | Kang et al. | |
| 8,400,828 | B2 * | 3/2013 | Torii | G11C 16/0433 257/314 |
| 2006/0105522 | A1 * | 5/2006 | Steimle | B82Y 10/00 438/257 |
| 2006/0118854 | A1 * | 6/2006 | Lee | H01L 27/105 257/315 |
| 2006/0134864 | A1 * | 6/2006 | Higashitani | H01L 27/105 438/257 |
| 2009/0269893 | A1 * | 10/2009 | Hashimoto | H01L 27/105 438/264 |
| 2009/0273013 | A1 | 11/2009 | Winstead et al. | |
| 2011/0204450 | A1 * | 8/2011 | Moriya | H01L 21/823462 257/369 |
| 2011/0309447 | A1 | 12/2011 | Arghavani et al. | |
| 2012/0034751 | A1 * | 2/2012 | Ariyoshi | H01L 21/823462 438/381 |
| 2015/0072489 | A1 * | 3/2015 | Baker, Jr. | H01L 29/66833 438/267 |

OTHER PUBLICATIONS

U.S. Appl. No. 14/470,374, Hong, Cheong M., Semiconductor Memory Cell and Driver Circuitry With Gate Oxide Formed Simultaneously, filed on Aug. 27, 2014.
U.S. Appl. No. 14/023,440, Baker, Frank Kelsey, Jr., Non-Volatile Memory (NVM) Cell and High-K and Metal Gate Transistor Integration, filed on Sep. 10, 2013.
Restriction Requirement dated Jan. 21, 2016 received in U.S. Appl. No. 14/656,832.
Non-final office action dated Apr. 1, 2016 in U.S. Appl. No. 14/656,832.

* cited by examiner

*Primary Examiner* — Shaun Campbell

(57) ABSTRACT

A semiconductor device and a method for making the semiconductor device are provided. The semiconductor device includes a non-volatile memory cell having a gate dielectric and formed in a non-volatile memory well region; a first transistor type formed using a first gate oxide and formed in a first transistor well region; a second transistor type formed using a second gate oxide and formed in a second transistor well region; and a third transistor type formed using a third gate oxide and formed in a third transistor well region. The gate dielectric and the first and second gate oxides are formed from the same oxide stack. The first, second, and third transistor types include extension implants formed using a first implant dopant, and the non-volatile memory cell includes extension implants formed using a second implant dopant, where the first and second implant dopants are different.

18 Claims, 9 Drawing Sheets

METHOD OF FORMING SUPRA LOW THRESHOLD DEVICES

BACKGROUND

1. Field

This disclosure relates generally to semiconductor devices, and more specifically, to memory cells formed on a same substrate with driver circuitry for the memory cells.

2. Related Art

As semiconductor devices continue to decrease in size and power requirements and performance requirements increase, manufacturers continually seek ways to improve device performance while reducing size and power used by the devices. Devices that operate in different additional power domains may be added, for which transistors having gate sizes that are different from other transistors may be required. While memory cells, low voltage logic devices, and high voltage logic devices can be fabricated on the same substrate, different mask steps are required to form the different devices, including different masks for different gate sizes. For example, adding low voltage logic transistors to a substrate with memory cells and high voltage logic devices can require five additional masks, which increases costs and fabrication time. Yet, if high and low voltage logic devices are formed with the same gate oxide to save mask steps, the low voltage devices will operate slowly, sacrificing speed in favor of lower manufacturing costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
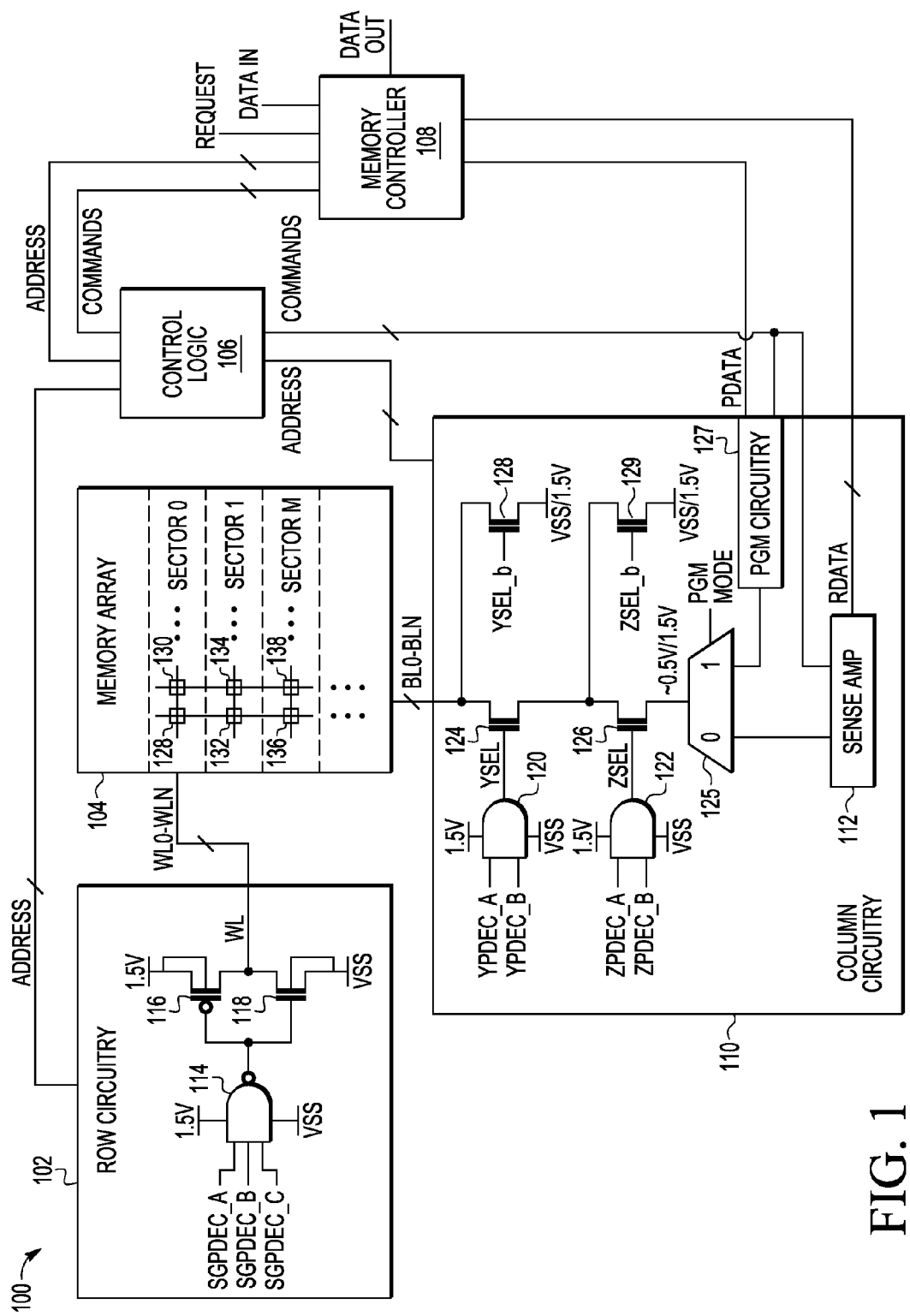
FIG. 1 illustrates, in block diagram form, a memory system having a memory array in accordance with one embodiment of the present disclosure.

Semiconductor devices and methods are disclosed in which gate oxides for a memory cell and supra low voltage devices may be formed at the same time, while gate oxides for low, medium, and high voltage and dual gate oxide devices may be formed independently from one another and from the memory cell and supra low voltage devices. Additionally, gate polysilicon for low, medium, high and supra low voltage devices can be formed at the same time, typically after the polysilicon for the gate(s) in the memory cell are formed. Source/drain extension and lightly doped drain (LDD) implants for supra low voltage devices and low power devices may be formed at the same time. The LDD implant for the supra low voltage device provides lower off current, which is more suitable for logic devices used in row and column select drivers for the memory cell. The thin gate oxide results in higher drive current from the supra low power devices, increasing performance while requiring less space due to smaller gate sizes.

As used herein, the term "supra low voltage" refers to device operating voltage that is higher than low voltage and lower than medium or high voltage devices. For example, low voltage can refer to voltages less than 1.1 Volts, supra low voltage can refer to voltages less than 2.0 Volts, medium voltage can refer to voltages less than 5.0 Volts and high voltage can refer to voltages less than 9 Volts. Other suitable ranges of voltage can be used for low, supra low, medium, and high voltages with the values here given for purposes of example only.

The present disclosure describes a method of forming non-volatile memory bit cells and drivers with same gate oxide but different well and extension implants. The supra low threshold (SLV) devices in the drivers have multiple threshold voltages. Combinations of oxide and implant sharing steps enable the construction of low cost devices without adding masking steps. These low cost devices provide good read performance, small die area, lower power and voltage scaling.

Generally, there is provided, a method for making a semiconductor device including: forming trench isolation regions in a surface of a substrate to delineate a high voltage transistor region, a first low voltage transistor region, a second low voltage transistor region, and a non-volatile memory region; forming a first oxide layer over the surface of the substrate; etching the first oxide layer from the second low voltage transistor region; forming a second oxide layer over the surface of the substrate; implanting first well regions through the first and second oxide layers in the high voltage transistor region, the first low voltage transistor region, and the non-volatile region; implanting a second well region through the second oxide layer in the second low voltage transistor region, wherein implanting the first well regions and second well region occurs concurrently; selectively etching the first and second oxide layers from the non-volatile memory region, and the first and second low voltage regions; forming a third oxide layer over the surface of the substrate; and forming a transistor gate electrode in each of the high voltage transistor region, the first low voltage transistor region, the second low voltage transistor region, and the non-volatile memory region. The method may further include forming extension implants in the non-volatile memory region, the high voltage transistor region, and the first and second low voltage transistor regions. Forming extension implants in the first and second low voltage transistor regions may further include forming the extension implants in the first and second low voltage transistor regions using a same implant dopant. Implanting the first and second well regions may further include implanting the first and second well regions in the first and second low voltage transistor regions using a same implant dopant. Implanting the first and second well regions may further include implanting different implant dopants in the non-volatile memory region and the high voltage transistor region than the first and second low voltage transistor regions. The third oxide layer may be used as a gate dielectric for the non-volatile memory region and for transistors in the first and second low voltage transistor regions. A transistor formed in the first low voltage transistor region may have a different threshold voltage than a transistor formed in the second low voltage transistor region. Implanting the first and second well regions may further include implanting the first and second well regions within a deep well region. Forming the first oxide layer, forming the second oxide layer, and forming the third oxide layer may further include forming a gate oxide of the high voltage transistor region using the first, second, and third oxide layers. The first and second low voltage transistor regions may be further characterized as first and second supra low voltage transistor regions, wherein a threshold voltage of a transistor in the first and second supra low voltage transistor regions may be lower than a threshold voltage of a transistor of the high voltage transistor region and higher than a threshold voltage of a transistor of a third low voltage transistor region.

In another embodiment, there is provided, a method for making a semiconductor device including: forming trench isolation regions in a surface of a substrate to delineate a high voltage transistor region, a first low voltage transistor region, a second low voltage transistor region, a third low voltage transistor region, and a non-volatile memory region; growing a first oxide layer over the surface of the substrate; etching the first oxide layer from the second low voltage transistor region; growing a second oxide layer over the surface of the substrate; implanting first well regions through the first and second oxide layers in the high voltage transistor region, the first low voltage transistor region, and the non-volatile region; implanting a second well region through the second oxide layer in the second low voltage transistor region, wherein implanting the first well regions and second well region occurs concurrently; selectively etching the first and second oxide layers from the non-volatile memory region, and the first and second low voltage regions; growing a third oxide layer over the surface of the substrate; etching the first, second, and third oxide layers from over the third low voltage transistor region; growing a fourth oxide layer over the surface of the substrate; and forming a transistor gate electrode in each of the high voltage transistor region, the first low voltage transistor region, the second low voltage transistor region, the third low voltage transistor region, and the non-volatile memory region. Implanting the first and second well regions may further include implanting the first, second, and third low voltage transistor regions with a same implant dopant. The method may further include implanting source/drain extensions in the first, second, and third low voltage transistor regions using a same implant dopant. The first and second low voltage transistor regions may be further characterized as first and second supra low voltage transistor regions, wherein a threshold voltage of a transistor in the first and second supra low voltage transistor regions may be lower than a threshold voltage of a transistor of the high voltage transistor region and higher than a threshold voltage of a transistor of the third low voltage transistor region. Forming trench isolation regions may further include delineating a dual gate transistor region, wherein transistors of the dual gate transistor region have a gate dielectric including the second, third, and fourth oxide layers. A transistor of each of the first and second low voltage transistor regions and the non-volatile memory region may have a gate dielectric formed from the third and fourth oxide layer. Selectively etching the first and second oxide layers from the non-volatile memory region, and the first and second low voltage regions may further include selectively etching the first and second oxide layers using a same photomask. The method may further include patterning a gate electrode for each of the high voltage transistor region, first, second, and third low voltage transistor regions, and the dual gate transistor region using a same photomask.

In yet another embodiment, there is provided, a semiconductor device including: a non-volatile memory cell having a gate dielectric and formed in a non-volatile memory well region; a first transistor type formed using a first gate oxide and formed in a first transistor well region; a second transistor type formed using a second gate oxide and formed in a second transistor well region; and a third transistor type formed using a third gate oxide and formed in a third transistor well region, wherein the gate dielectric and the first and second gate oxides may be formed from the same oxide stack, and wherein the first, second, and third transistor types include extension implants formed using a first implant dopant, and the non-volatile memory cell includes extension implants formed using a second implant dopant, and wherein the first and second implant dopants may be different. The first transistor type may be characterized as a first supra low voltage transistor type having a first threshold voltage, the second transistor type may be characterized as a second supra low voltage transistor type having a second threshold voltage different from the first threshold voltage, and the third transistor type may be characterized as being a low voltage transistor type having a third threshold voltage lower than the first and second threshold voltage.

FIG. 1 illustrates, in block diagram form, a memory system 100 in accordance with one embodiment of the present disclosure. The memory system 100 may be a non-volatile memory system or any suitable memory type. Memory system 100 includes an exemplary split gate memory cell array 104 which includes a plurality of memory cells, such as memory cells 128, 130, 132, 134, 136, and 138. Array 104 may be partitioned into any number of sectors. In the illustrated embodiment, array 104 includes M+1 sectors, such as sector 0, sector 1, through sector M. Memory system 100 also includes row circuitry 102, column circuitry 110, control logic 106, and memory controller 108. Control logic 106 is coupled to each of row circuitry 102 and column circuitry 110, and column circuitry 110 is coupled to memory controller 108. Memory controller 108 is also coupled to row circuitry 102 and control logic 106.

Array 104 includes any number of bit lines, including BL0, BL1, BL2, etc. Each of these bit lines is coupled to column circuitry 110 which may include the appropriate sense amplifiers 112 and writing circuitry to read/write to the bit cells of array 104. Each sector of array 104 includes any number of word lines. For example, sector 0 includes N+1 word lines: WL00, WL01, through WL0N, and sector 1 includes N+1 word lines: WL10, WL11, through WL1N. Each of these word lines is coupled to row circuitry 102. A memory cell is coupled to the intersection of each word line and bit line. In the illustrated embodiment, memory cell 128 is coupled to WL00 and BL0 and is in sector 0, memory cell 130 is coupled to WL00 and BL1 and is in sector 0, memory cell 132 is coupled to WL01 and BL0 and is in sector 0, memory cell 134 is coupled to WL01 and BL1 and is in sector 0, memory cell 136 is coupled to WL10 and BL0 and is in sector 1 and memory cell 138 is coupled to WL10 and BL1 and is in sector 1. Note that each word line may be referred to as a row and each bit line as a column of array 104. As will be described in further detail below, row circuitry 102 provides the appropriate voltage values to each of the word lines, in which the word lines are coupled to the select gates of each memory cell. Memory controller 108 communicates with row circuitry 102, column circuitry 110, and control logic 106 as needed to read and write array 104. Control logic 106 also provides the appropriate voltage values for the control gates and the source terminals of each memory cell of array 104. For example, the control gate of each memory cell of sector 0 is coupled to receive control gate voltage, the source terminal of each memory cell of sector 0 is coupled to receive source terminal voltage, the control gate of each memory cell of sector 1 is coupled to receive control gate voltage, and the source terminal of each memory cell of sector 1 is coupled to receive source terminal voltage. In the illustrated embodiment, each memory cell within a sector receives the same control gate voltage and the same source terminal voltage. That is, in the illustrated embodiment, note that, within each sector, the control gate voltage is a common voltage node and the source terminal voltage is a common voltage node.

Figure 2:
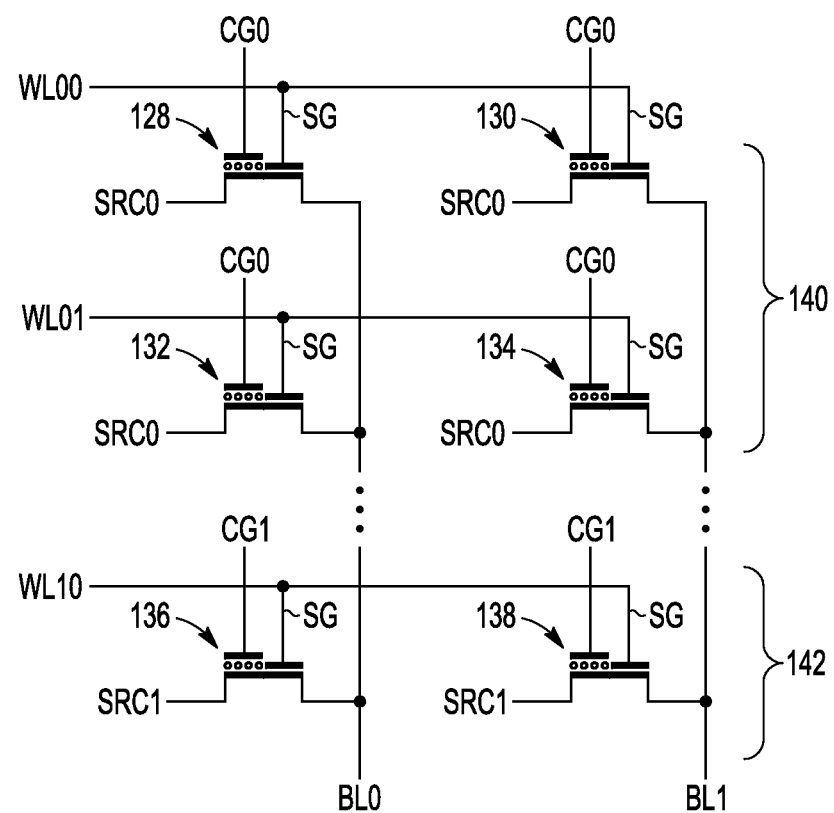
FIG. 2 illustrates, in schematic form, a portion of the memory array of FIG. 1 in further detail, in accordance with one embodiment of the present disclosure.

FIG. 2 illustrates a portion of array 104 including memory cells 128, 130, 132, 134, 136, and 138 in further detail. Memory cell 128 has a control gate coupled to receive CG0, a select gate coupled to WL00, a source terminal coupled to receive SRC0, and a drain terminal coupled to BL0. Memory cell 130 has a control gate coupled to receive CG0, a select gate coupled to WL00, a source terminal coupled to receive SRC0, and a drain terminal coupled to BL1. Memory cell 132 has a control gate coupled to receive CG0, a select gate coupled to WL01, a source terminal coupled to receive SRC0, and a drain terminal coupled to BL0. Memory cell 134 has a control gate coupled to receive CG0, a select gate coupled to WL01, a source terminal coupled to receive SRC0, and a drain terminal coupled to BL1. Memory cell 136 has a control gate coupled to receive CG1, a select gate coupled to WL10, a source terminal coupled to receive SRC1, and a drain terminal coupled to BL0. Memory cell 138 has a control gate coupled to receive CG1, a select gate coupled to WL10, a source terminal coupled to receive SRC1, and a drain terminal coupled to BL1.

During a program operation, a particular memory cell of array 104 is selected for programming by an access address and data corresponding to an access request. Row circuitry 102 activates a selected word line corresponding to the access address and column circuitry 110 couples a current sink to the selected bit line corresponding to the access address, which causes the selected memory cell to be conductive. In the illustrated embodiment, it will be assumed that for a program operation, memory cell 128 is selected for programming, and memory cells 130, 132, 134, 136, and 138 are unselected. In this case, sector 0 is selected since the selected word line is in sector 0, and all other sectors, including sector 1, are deselected. If memory cell 128 is selected, WL00 is activated, and a current sink within column circuitry 110 is coupled to the selected bit line, BL0.

Note that although memory cells 128-138 are shown as split gate thin film storage memory cells, memory cells 128-138 can be any type of memory cell that includes a gate dielectric.

Referring back to FIG. 1, row circuitry 102 is shown with one of several word line drivers that includes NAND gate 110 having an output coupled to control gates of P-channel transistor 116 and N-channel transistor 118. Inputs to NAND gate 110 include select gate decode signals SGPDECA, SGPDECB, SGPDECC, which are based on an address of the memory cell to be accessed that is decoded by row circuitry 102. Circuitry of NAND gate 110 is coupled between a first supply voltage, such as 1.5 Volts, and a second supply voltage, such as ground or VSS. A source electrode and body tie of P-channel transistor 116 is coupled to the first supply voltage, such as 1.5 Volts, and a drain electrode of P-channel transistor 116 is coupled to a drain electrode of N-channel transistor 118. A source electrode of N-channel transistor 118 is coupled to the second supply voltage, such as VSS or ground. A word line WL00 is coupled between the drains of P-channel transistor 116 and N-channel transistor 118. Other similar driver circuits can be included in row circuitry 102 to drive other word lines WL01-WLMN, where M is the number of sectors and N is the number of rows in array 104.

Column circuitry 110 is shown with one of several bit line drivers that includes AND gates 120, 122, and N-channel transistors 124, 126, 128, 129. AND gate 120 includes input terminals coupled to address decode signals YPDECA and YPDECB. Circuitry of respective AND gates 120, 122 is coupled between a first supply voltage, such as 1.5 Volts, and a second supply voltage, such as ground or VSS. An output of AND gate 120 (shown as YSEL) is coupled to a gate electrode of N-channel transistor 124 and an output of AND gate 122 (shown as ZSEL) is coupled to a gate electrode of N-channel transistor 126. A drain electrode of N-channel transistor 124 is coupled to a first bit line BL0, and a source electrode of N-channel transistor 124 is coupled to a drain electrode of N-channel transistor 126. A source electrode of N-channel transistor 126 can be coupled to sense amplifier 112 through multiplexer 125. Sense amplifier 112 can receive currents via bit line BL0 to determine the data stored by a corresponding memory cell. Input/output circuitry 127 coupled to multiplexer 125 can provide voltages to read data from and write data to selected memory cells 128, 132, 136 in the column of array 104 coupled to bit line BL0. N-channel transistor 128 includes a drain electrode coupled to bit line BL0, a source electrode coupled to a supply voltage that can vary between the first supply voltage, such as 1.5 Volts, and VSS or ground. A gate electrode of N-channel transistor is coupled to a complement of the output of AND gate 120 (shown as YSELB). N-channel transistor 129 includes a drain electrode coupled to the source electrode of N-channel transistor 126 and a source electrode coupled to the output of multiplexer 125. A gate electrode of N-channel transistor is coupled to a complement of the output of AND gate 122 (shown as ZSELB).

Memory system 100 includes logic devices that use supra low power and high power. For example, logic devices in row circuitry 102 and column circuitry 110 that use supra low power include NAND gate 114, AND gates 120, 122, and N-channel transistors 118, 128, 129. Devices that use high power can include sense amplifier 112 and P-channel transistor 116. Forming such diverse logic circuitry and memory cells on the same substrate can substantially increase the number of masks required to form the various devices. Embodiments of devices and manufacturing methods described herein reduce the number of masks required by forming the gate oxides of memory cells 128-138 and supra low power logic devices 114, 118, 120, 122, 128, 129 during the same stage of manufacture.

FIGS. 3-10 show side cross-sectional views of an embodiment of a semiconductor device 300 that includes semiconductor wafer or substrate 302 with an NVM region 318, dual gate region 320, high voltage logic region 322, low voltage logic region 324, a first supra low voltage logic region 326, and a second supra low voltage logic region 328 during subsequent stages of manufacture. Dual gate region 320, high voltage logic region 322, low voltage logic region 324 first supra low voltage logic region 326, and a second supra low voltage logic region 328 are also referred to as logic regions 320-328 herein.

Figure 3:
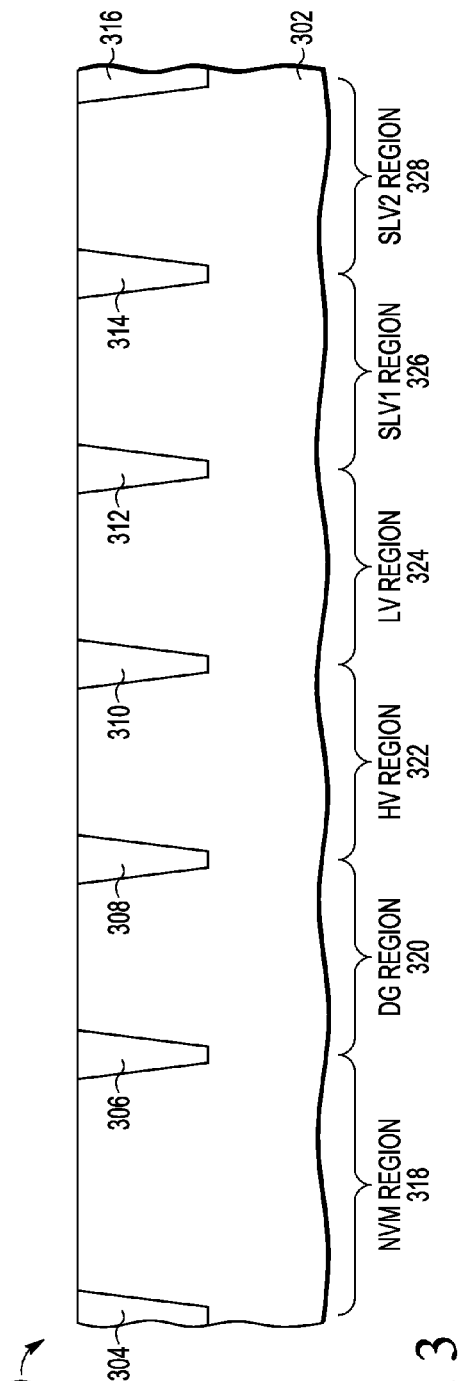
FIGS. 3-10 show side cross-sectional views of embodiments of a semiconductor device having NVM region, dual gate region, high voltage logic region, and low voltage logic regions during subsequent stages of manufacture.

FIG. 3 shows a semiconductor device 300 having a substrate 302 with trench isolation regions 304-316. Substrate 302 can be any semiconductor material or combinations of materials, such as gallium arsenide, silicon germanium, silicon-on-insulator (SOI), silicon, monocrystalline silicon, the like, and combinations of the above. For purposes of example, substrate 302 is assumed to be a P type material, however material with opposite polarity may be used.

Trench isolation regions 304-316 are formed by removing portions of substrate 302 at the desired locations and filling regions 304-316 with insulating material, such as oxide. Isolation regions 304-316 electrically isolate devices in regions 318-328 from one another.

Figure 4:
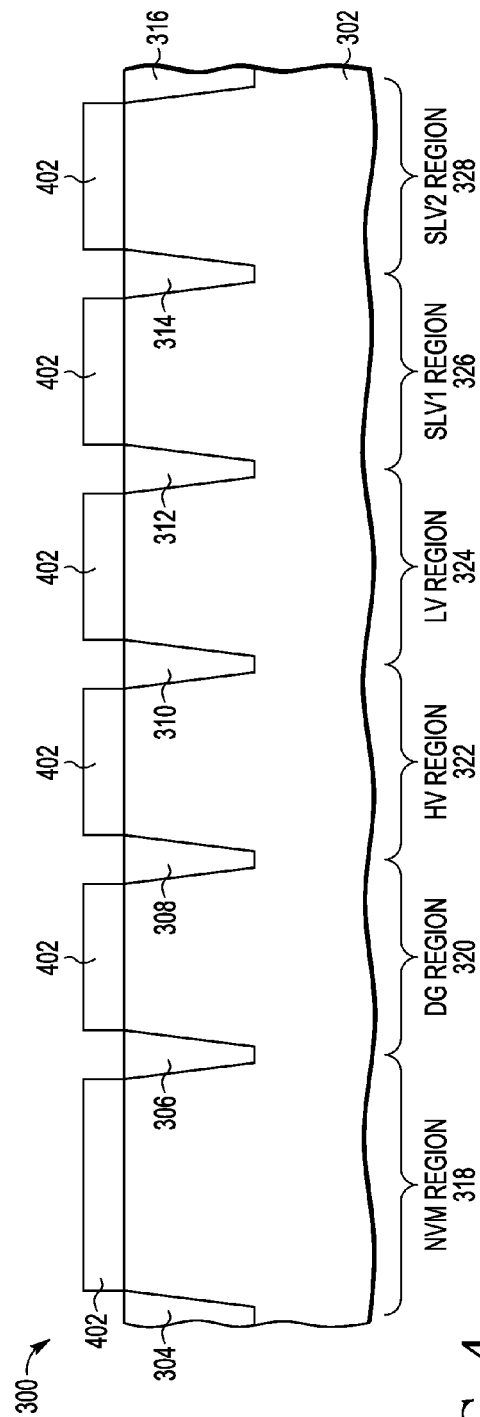

FIG. 4 shows semiconductor device 300 with insulating layer 402 on the surface of semiconductor substrate 302, but not over trench isolation regions 304-314. Insulating layer 402 can be any suitable material such as a grown oxide ranging in thickness from 80 to 250 Angstroms.

Figure 5:
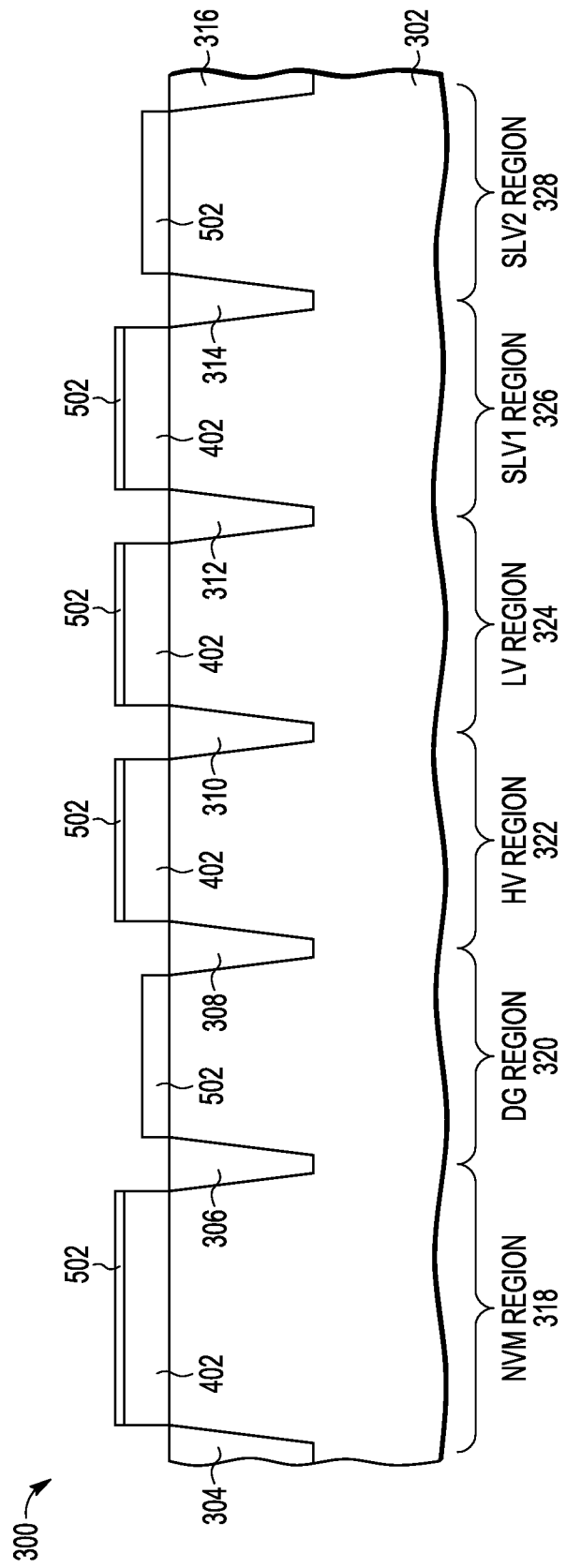

FIG. 5 shows semiconductor device 300 after a protective mask such as photoresist is placed over NVM region 318, high voltage logic region 322, low voltage logic region 324, and a first supra low voltage logic region 326, and insulating layer 402 is removed from regions 320 and 328 but retained over NVM region 318, high voltage logic region 322, low voltage logic region 324, and a first supra low voltage logic region 326. For the case of insulating layer 402 being silicon oxide, etching can be achieved using a reactive ion etch (RIE) or an HF wet etch. Another suitable isotropic etch may be used. For the case of insulating layer 402 being a high K dielectric, a different etchant, one that is selective between the high K dielectric and the semiconductor material of substrate 302, can be used.

Insulating layer 502 is then formed over regions 318-328, including over the portion of insulating layer 402 remaining over NVM region 318, high voltage logic region 322, low voltage logic region 324, and a first supra low voltage logic region 326. Insulating layer 502 can be any suitable material such as a grown oxide ranging in thickness from 20 to 80 Angstroms. Insulating layer 502 is shown above insulating layer 402 in NVM region 318, high voltage logic region 322, low voltage logic region 324, and a first supra low voltage logic region 326 to indicate both insulating layers 402, 502 remain to create a relatively thicker gate oxide.

Figure 6:
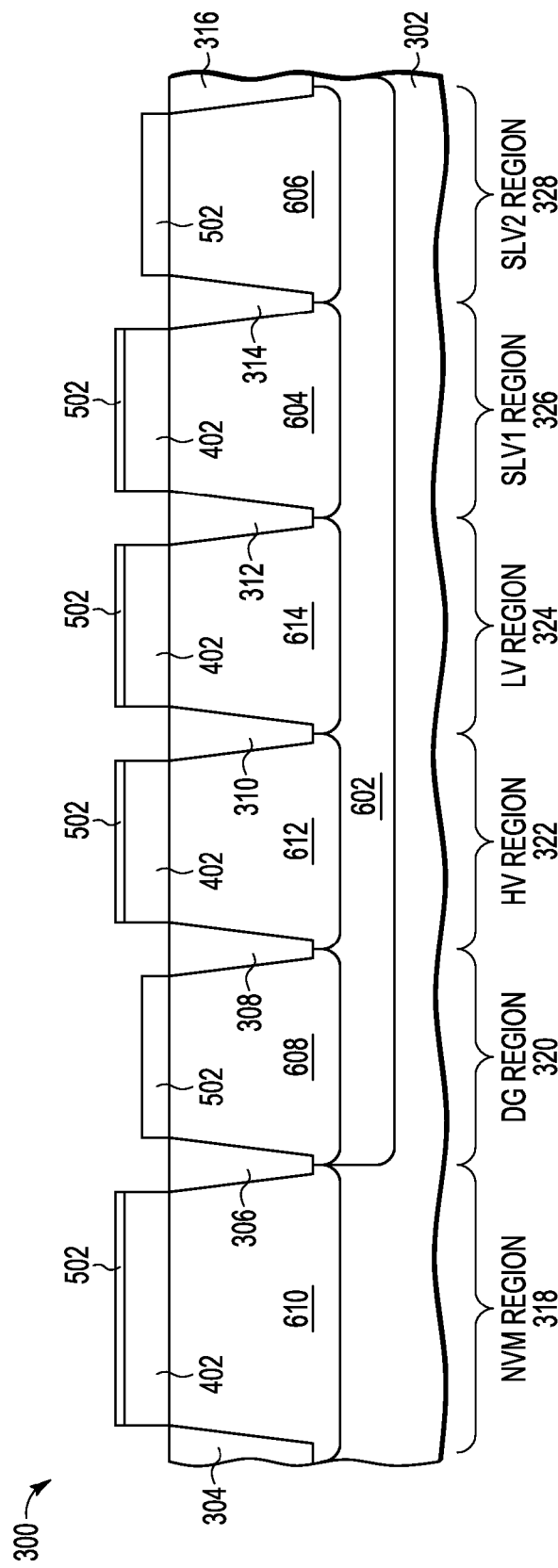

FIG. 6 shows semiconductor device 300 after wells 602-614 are formed. Deep N well 602 can be formed by masking NVM region 318 with a protective material such as patterned photoresist and forming a doped region of semiconductor material within substrate 302 at a depth below a depth planned for P wells 604-614 and that extends under trenches 306-316. The deep N well 602 is then formed by implanting N-type ions, such as antimony or phosphorous ions with a dopant concentration in the range of about 1E12 to about 1E14 at an energy level in the range of about 800 kilo-electron volts (keV) to about 2000 keV. In the illustrated embodiment, the depth of deep N well 326 (after subsequent thermal annealing or any other diffusion) is in the range of about 8000 to 15000 Angstroms.

P wells 604-614, can be formed by implanting as a P-type silicon material having a P-type dopant such as boron, boron difluoride (BF2) or other suitable P-type material. In some embodiments, doping is performed with an energy ranging from 15 to 800 kilo-electron Volts (keV) with a dose ranging from 1E12 to 5E13 per cubic centimeter (cm3). In the illustrated embodiment, the depth of deep P wells 604-614 is in the range of about 100 to 8000 Angstroms.

P wells 604, 606, and 614 in the low voltage logic regions 324-328 are formed during a common implantation processing step. Because the gate oxide 502 of the second supra low voltage logic region 328 is different from the stacked gate oxide 402, 502 of the first supra low voltage logic region 326, implantation through the different gate oxides results in a doping profile of P well 604 being different from the doping profile of P well 606. In this embodiment, gate oxide 502 of the second supra low voltage logic region 328 is thinner than the stacked gate oxide 402, 502 of the first supra low voltage logic region 326.

Figure 7:
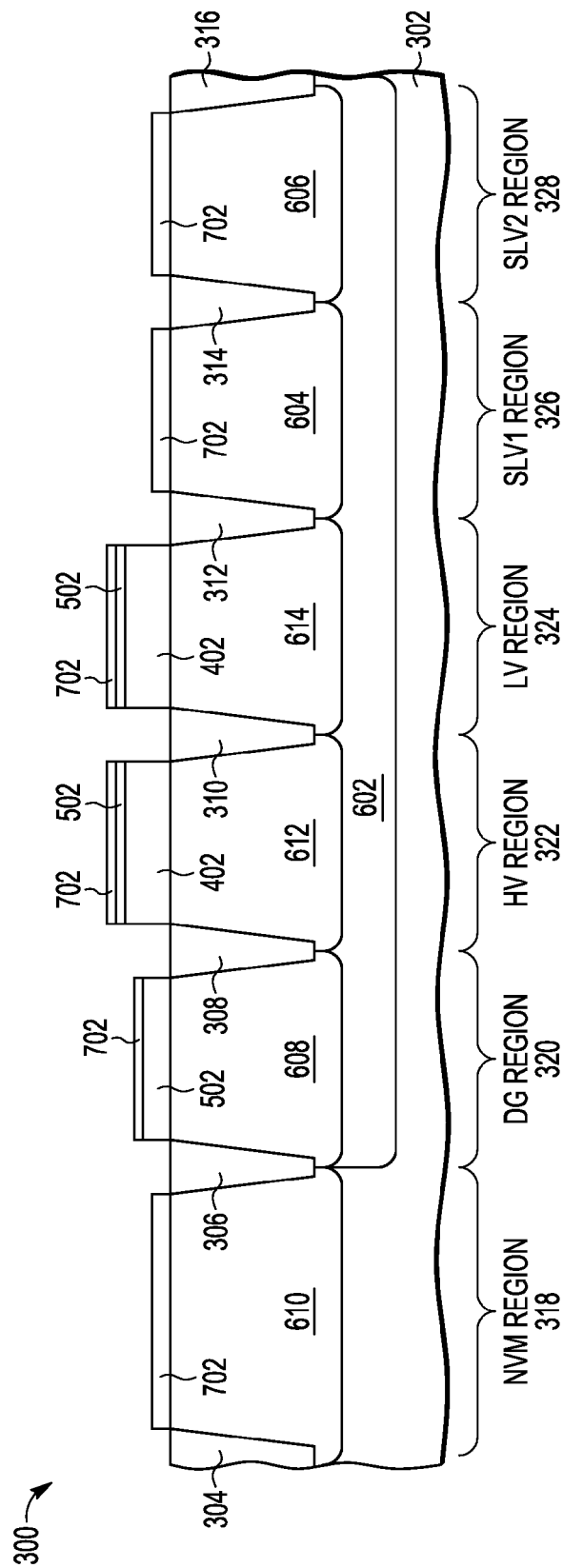

FIG. 7 shows semiconductor device 300 after a protective mask such as photoresist is placed over dual gate region 320, high voltage region 322, and low voltage region 324, and insulating layers 402, 502 is removed from NVM region 318 and supra low voltage logic region 326, and insulating layer 502 is removed from supra low voltage region 328. For the case of insulating layers 402, 502 being silicon oxide, etching can be achieved using a reactive ion etch (RIE) or an HF wet etch. Another suitable isotropic etch may be used. For the case of insulating layers 402, 502 being a high K dielectrics, a different etchant, one that is selective between the high K dielectric and the semiconductor material of substrate 302, can be used.

The protective layer over regions 320, 322 and 324 is then removed. Insulating layer 702 is then formed over regions 318-328, including over the portion of insulating layer 502 remaining over dual gate region 320, high voltage region 322, and low voltage region 324. Insulating layer 702 can be any suitable material such as a grown oxide ranging in thickness from 15 to 60 Angstroms. Insulating layer 702 is shown above insulating layer 502 in dual gate region 320, high voltage region 322, and low voltage region 324 to indicate insulating layer 502 remains to form a relatively thick gate oxide, even though insulating layers 402, 502, 702 may be of the same or similar material.

Figure 8:
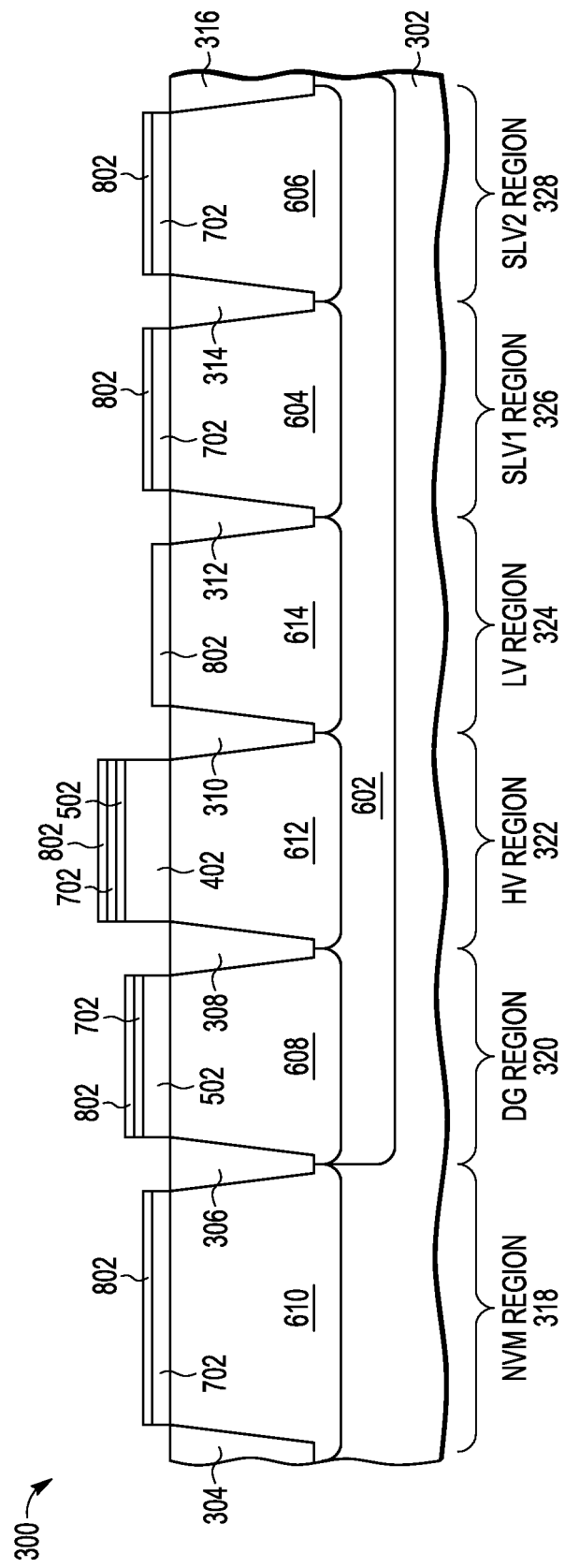

FIG. 8 shows semiconductor device 300 after a protective mask such as photoresist is placed over NVM region 318, dual gate region 320, high voltage logic region 322, first supra low voltage logic region 326, and second supra low voltage logic region 328, and insulating layer 702 is removed from low voltage region 324. For the case of insulating layer 702 being silicon oxide, etching can be achieved using a reactive ion etch (RIE) or an HF wet etch. Another suitable isotropic etch may be used. For the case of insulating layer 702 being a high K dielectric, a different etchant, one that is selective between the high K dielectric and the semiconductor material of substrate 302, can be used.

The protective layer over regions 318, 320, 322, 326 and 328 is then removed. Insulating layer 802 is subsequently formed over regions 318-328, including over the portion of insulating layer 702 remaining over NVM region 318, dual gate region 320, high voltage logic region 322, first supra low voltage logic region 326, and second supra low voltage logic region 328. Insulating layer 802 can be any suitable material such as a grown oxide ranging in thickness from 10 to 40 Angstroms. Insulating layer 802 is shown above insulating layer 702 in NVM region 318, dual gate region 320, high voltage logic region 322, first supra low voltage logic region 326, and second supra low voltage logic region 328, to indicate insulating layer 702 remains to form a relatively thick gate oxide, even though insulating layers 702, 802 may be of the same or similar material.

The gate dielectric for regions 318-328 are now complete with the gate dielectric for NVM region 318 including insulating layers 702 and 802, the gate dielectric for dual gate region 320 including insulating layers 502, 702 and 802, the gate dielectric for high voltage region 322 including insulating layers 402, 502, 702 and 802, the gate dielectric for low voltage region 324 including insulating layer 802, the gate dielectric for first supra low voltage region 326 including insulating layers 702 and 802, and the gate dielectric for second supra low voltage region 328 including insulating layers 702 and 802. Note that the gate dielectrics for NVM region 318 and supra low voltage regions 326, 328 have the same thickness and are formed concurrently, instead of the gate dielectric for the NVM region 318 being formed separately from the gate dielectrics for logic regions 320-328. As devices that operate on different voltages are added, the thickness required for the gate dielectrics will vary, adding to the cost of manufacturing due to the requirement for additional masking steps. Significantly, forming the gate dielectric for NVM region 318 concurrently with supra low voltage regions 326, 328 avoids the need to form another set of masks that would be required if the gate dielectric for supra low voltage regions 326, 328 and logic regions 320-324 were formed independently of the gate dielectric for NVM region 318.

Figure 9:
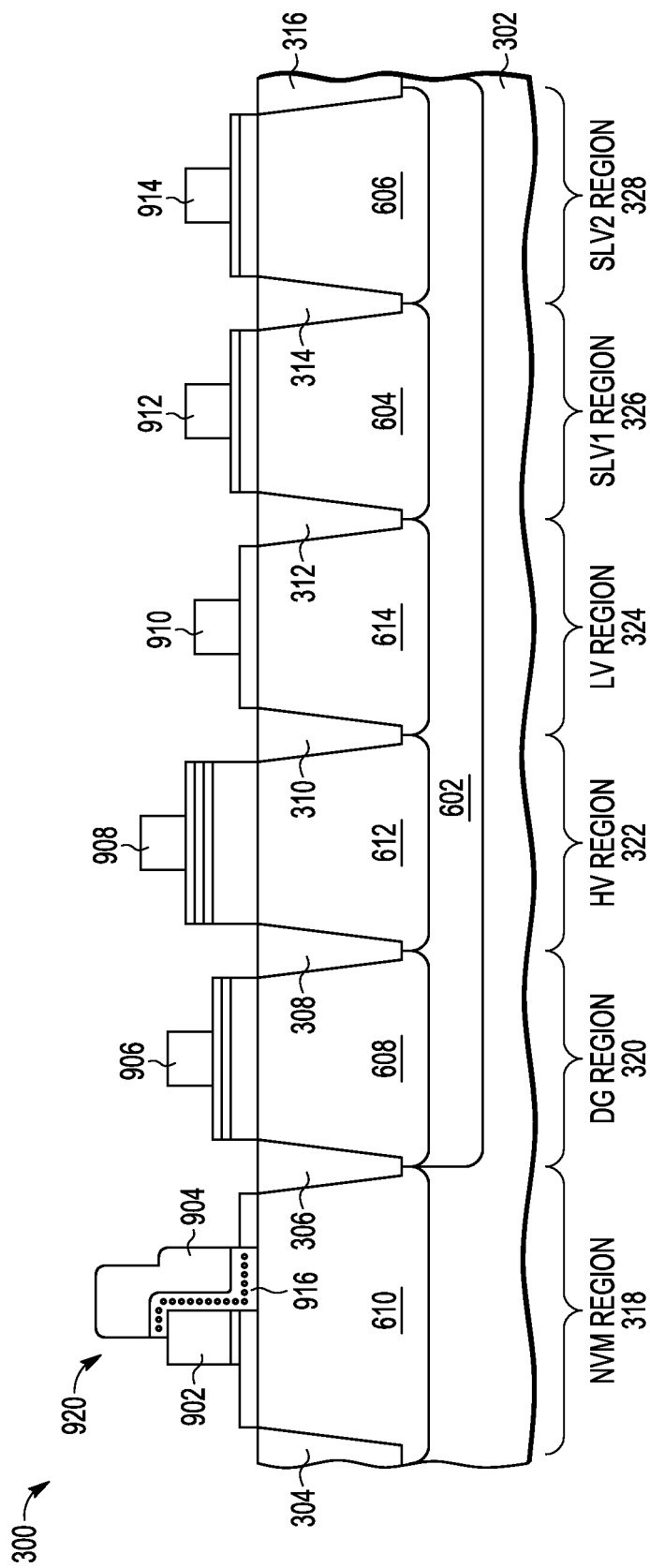

FIG. 9 shows semiconductor device 300 after deposited polysilicon is formed into gate structures 906-914 in logic regions 320-328 and NVM cell 920 is formed in the NVM region 318. The NVM cell 920 in this embodiment has an overlapping split gate structure, however techniques and structures disclosed herein can be used on any type of memory cell with gate dielectric. An array of NVM cells 104 shown for example in FIG. 1 can be formed on substrate 302.

NVM cell 920 includes a select gate formed of gate dielectrics 702, 802 and a conductive layer 902 such as doped polysilicon with a thickness of 150 nanometers thick, but could be another suitable material and thickness. Conductive layer 902 and gate dielectrics 702, 802 have been etched according to a pattern. For the case of gate dielectrics 702, 802 being silicon oxide, etching can be achieved using a reactive ion etch (RIE) or an HF wet etch. Another isotropic etch may be used. For the case of gate dielectrics 702, 802 being a high K dielectric, a different etchant, one that is selective between the high K dielectric and the semiconductor material of substrate 302, could be used.

After etching gate dielectrics 702, 802, a charge storage layer 916 is formed including a bottom dielectric layer, a layer of charge storage elements and a top dielectric layer. The charge storage elements may be formed by depositing and annealing discrete storage elements of polysilicon, germanium, metal, silicon carbide, silicon nitride, or other suitable metal or silicon material or any combinations of these materials. The bottom dielectric layer may be a thermal layer in order to provide a high quality dielectric. A high-k dielectric material may be used as the bottom dielectric layer with metal nanocrystals or when a lower temperature silicon nanocrystal formation process is used. The top oxide or dielectric layer may be formed of a suitable dielectric material such as silicon dioxide, silicon oxynitride, or silicon nitride. Another conductive layer 904 is formed over charge storage lager 916. Conductive layer 904 may be doped polysilicon or other conductive material or combination of materials. Charge storage layer 916 and conductive layer 904 are patterned with a first portion that partially overlaps select gate 902 and another portion that partially overlaps substrate 302.

The gate structures 906-914 vary in size, depending on the voltage expected to be used when operating a corresponding device. For example, the size of gate 908 in high voltage region 322 is much larger than gates 906, 910, 912, 914 in respective dual gate region 320, low voltage region 324, first supra low voltage region 326, and second supra low voltage region 328. Further, the gate dielectric for each logic gate 906-914 each have different thicknesses directly proportional to the voltages expected to be used during operation.

Figure 10:
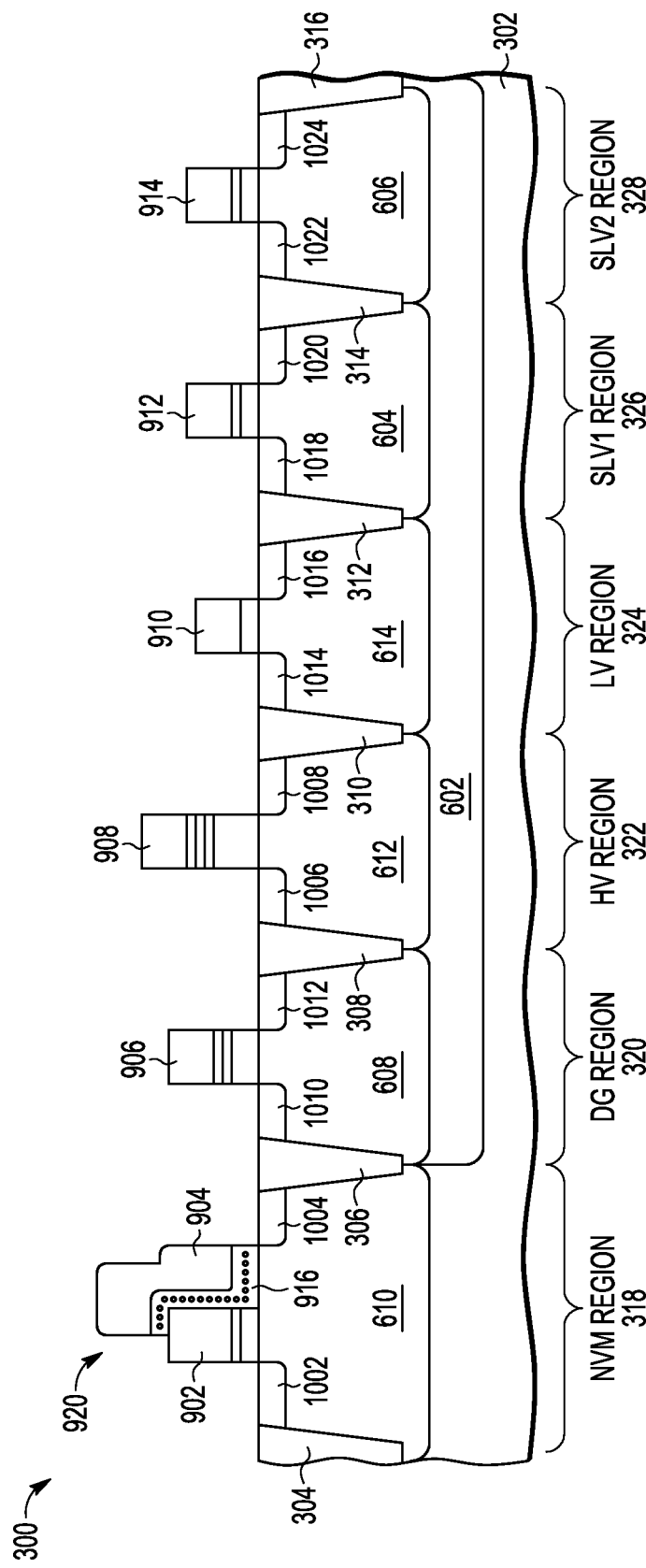

FIG. 10 shows semiconductor device 300 after gate dielectric layers 402, 502, 702, 802 (FIG. 8) are etched according to gate structures 906-914 and source/drain regions 1002-1024 are formed. Source/drain regions are formed by implanting P wells 604-614 with N-type ions, such as arsenic or phosphorous ions. Source/drain regions may be formed by an extension implant followed by a deep implant. An extension implant is typically performed by implanting through a screen oxide to form a shallow junction near the device channel. A protective mask such as photoresist is typically deposited over one or more of the semiconductor device regions 318-328 while source/drain regions are formed in unmasked regions. For example, a photoresist mask may be deposited over NVM region 318, dual gate region 320, and high voltage logic region 322 when forming source/drain regions 1014-1024 in the P wells 604, 606, and 614 of low voltage logic regions 324-328. In another example, a photoresist mask may be deposited over NVM region 318, high voltage logic region 322, and low voltage logic region 324 such that forming source/drain regions 1010, 1012, 1018-1024 in the dual gate region 320 and the supra low voltage logic regions 326, 328 use a common mask and common implant process including dopant, dose, and energy. One or more source/drain regions may be implanted with a first extension implant followed by a second extension implant below the first extension implanted region. One or more source/drain regions may also be implanted with a subsequent deep implant below the extension implant(s). One or more of regions 318-328 of the semiconductor device 300 may be implanted with a different dopant from other regions. For example, the NVM region 318 and the high voltage logic region 322 may be implanted with an arsenic dopant while dual gate region 320 and low voltage logic regions 324-328 may be implanted with a phosphorus dopant. Generally, transistors formed in the high voltage logic region 322 may have higher threshold voltages than those formed in the low voltage logic region 324, and transistors formed in the low voltage logic region 324 may have lower threshold voltages than those formed in the supra low voltage logic regions 326, 328.

In this embodiment, source/drain regions for transistors formed in supra low voltage logic regions 326, 328 are implanted with common source/drain implants. Because doping profiles of P well 604 and P well 606 are different (FIG. 6), transistors formed in the first supra low voltage logic region 326 have a different threshold than transistors formed in the second supra low voltage logic region 328. For example, transistors formed in the second supra low voltage logic region 328 may have a 10 mV to 30 mV higher N channel threshold and may have an 60 mV to 100 mV lower P channel threshold than those formed in the first supra low voltage logic region 326.

Semiconductor device 300 may undergo further processing as known by those skilled in the art such as, for example, salicidation of source/drain extension regions 1002-1024 and exposed portions of select gate 902, control gate 904, and logic gates 906-914 using conventional processing techniques. In addition, one or more metal interconnect layers (not shown) may be formed to provide electrical connections for components on semiconductor device 300. Also further processing to form P-type devices may be performed, as understood by those skilled in the art.

The semiconductor substrate described herein can be any semiconductor material or combinations of materials, such as gallium arsenide, silicon germanium, silicon-on-insulator (SOI), silicon, monocrystalline silicon, the like, and combinations of the above.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different memory system components. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a semiconductor device, the method comprising:
   forming trench isolation regions in a surface of a substrate to delineate a high voltage transistor region, a first low voltage transistor region, a second low voltage transistor region, and a non-volatile memory region;
   forming a first oxide layer over the surface of the substrate;
   etching the first oxide layer from the second low voltage transistor region;
   forming a second oxide layer over the surface of the substrate;
   implanting first well regions through the first and second oxide layers in the high voltage transistor region, the first low voltage transistor region, and the non-volatile region;
   implanting a second well region through the second oxide layer in the second low voltage transistor region, wherein implanting the first well regions and second well region occurs concurrently;
   selectively etching the first and second oxide layers from the non-volatile memory region, and the first and second low voltage regions;
   forming a third oxide layer over the surface of the substrate; and
   forming a transistor gate electrode in each of the high voltage transistor region, the first low voltage transistor region, the second low voltage transistor region, and the non-volatile memory region.

2. The method of claim 1, further comprising forming extension implants in the non-volatile memory region, the high voltage transistor region, and the first and second low voltage transistor regions.

3. The method of claim 2, wherein forming extension implants in the first and second low voltage transistor regions further comprises forming the extension implants in the first and second low voltage transistor regions using a same implant dopant.

4. The method of claim 1, wherein implanting the first and second well regions further comprises implanting the first and second well regions in the first and second low voltage transistor regions using a same implant dopant.

5. The method of claim 4, wherein implanting the first and second well regions further comprises implanting different implant dopants in the non-volatile memory region and the high voltage transistor region than the first and second low voltage transistor regions.

6. The method of claim 1, wherein the third oxide layer is used as a gate dielectric for the non-volatile memory region and for transistors in the first and second low voltage transistor regions.

7. The method of claim 1, wherein a transistor formed in the first low voltage transistor region has a different threshold voltage than a transistor formed in the second low voltage transistor region.

8. The method of claim 1, wherein implanting the first and second well regions further comprises implanting the first and second well regions within a deep well region.

9. The method of claim 1, wherein forming the first oxide layer, forming the second oxide layer, and forming the third oxide layer further comprises forming a gate oxide of the high voltage transistor region using the first, second, and third oxide layers.

10. The method of claim 1, wherein the first and second low voltage transistor regions are further characterized as first and second supra low voltage transistor regions, wherein a threshold voltage of a transistor in the first and second supra low voltage transistor regions are lower than a threshold voltage of a transistor of the high voltage transistor region and higher than a threshold voltage of a transistor of a third low voltage transistor region.

11. A method for making a semiconductor device, the method comprising:
    forming trench isolation regions in a surface of a substrate to delineate a high voltage transistor region, a first low voltage transistor region, a second low voltage transistor region, a third low voltage transistor region, and a non-volatile memory region;

growing a first oxide layer over the surface of the substrate;

etching the first oxide layer from the second low voltage transistor region;

growing a second oxide layer over the surface of the substrate;

implanting first well regions through the first and second oxide layers in the high voltage transistor region, the first low voltage transistor region, and the non-volatile region;

implanting a second well region through the second oxide layer in the second low voltage transistor region, wherein implanting the first well regions and second well region occurs concurrently;

selectively etching the first and second oxide layers from the non-volatile memory region, and the first and second low voltage regions;

growing a third oxide layer over the surface of the substrate;

etching the first, second, and third oxide layers from over the third low voltage transistor region;

growing a fourth oxide layer over the surface of the substrate; and forming a transistor gate electrode in each of the high voltage transistor region, the first low voltage transistor region, the second low voltage transistor region, the third low voltage transistor region, and the non-volatile memory region.

12. The method of claim 11, wherein implanting the first and second well regions further comprises implanting the first, second, and third low voltage transistor regions with a same implant dopant.

13. The method of claim 11, further comprising implanting source/drain extensions in the first, second, and third low voltage transistor regions using a same implant dopant.

14. The method of claim 11, wherein the first and second low voltage transistor regions are further characterized as first and second supra low voltage transistor regions, wherein a threshold voltage of a transistor in the first and second supra low voltage transistor regions are lower than a threshold voltage of a transistor of the high voltage transistor region and higher than a threshold voltage of a transistor of the third low voltage transistor region.

15. The method of claim 11, wherein forming trench isolation regions further comprises delineating a dual gate transistor region, wherein transistors of the dual gate transistor region have a gate dielectric comprising the second, third, and fourth oxide layers.

16. The method of claim 11, wherein a transistor of each of the first and second low voltage transistor regions and the non-volatile memory region have a gate dielectric formed from the third and fourth oxide layer.

17. The method of claim 11, wherein selectively etching the first and second oxide layers from the non-volatile memory region, and the first and second low voltage regions further comprises selectively etching the first and second oxide layers using a same photomask.

18. The method of claim 11, further comprising patterning a gate electrode for each of the high voltage transistor region, first, second, and third low voltage transistor regions, and the dual gate transistor region using a same photomask.

* * * * *